United States Patent [19]

Shinada et al.

[11] Patent Number: 4,597,824
[45] Date of Patent: Jul. 1, 1986

[54] METHOD OF PRODUCING SEMICONDUCTOR DEVICE

[75] Inventors: Kazuyoshi Shinada; Masaki Sato, both of Yokohama, Japan

[73] Assignee: Kabushiki Kaisha Toshiba, Kawasaki, Japan

[21] Appl. No.: 670,010

[22] Filed: Nov. 9, 1984

[30] Foreign Application Priority Data

Nov. 11, 1983 [JP] Japan .................................. 58-212050
Nov. 24, 1983 [JP] Japan .................................. 58-220976
Aug. 7, 1984 [JP] Japan .................................. 59-165134

[51] Int. Cl.$^4$ .................. H01L 21/306; B44C 1/22; C03C 15/00; C03C 25/06
[52] U.S. Cl. .................... 156/643; 29/571; 29/576 B; 29/580; 148/187; 148/188; 156/646; 156/653; 156/657; 156/662; 357/23.4; 357/41; 357/91
[58] Field of Search .............. 29/576 B, 571, 580, 29/591; 148/187, 188, 1.5, 190; 156/643, 646, 653, 657, 659.1, 662; 357/23, 41, 59, 91; 204/192 E

[56] References Cited

U.S. PATENT DOCUMENTS 4,484,388 11/1984 Iwasaki .................................. 29/571
4,498,227 2/1985 Howell et al. ....................... 29/576 B
4,506,437 3/1985 Godejahn ........................... 156/653 X

OTHER PUBLICATIONS

Itoh, T., et al, "Effect of Atmospheres on Arsenic Diffusion into Silicon from the Doped Oxide Layer", *Journal of Applied Physics*, vol. 46, No. 5, May 1975.

Primary Examiner—William A. Powell
Attorney, Agent, or Firm—Schwartz, Jeffery, Schwaab, Mack, Blumenthal & Evans

[57] ABSTRACT

A method of producing a MOS transistor of LDD structure with p(n) type pockets. A doped oxide film in which impurities such as phosphorus and impurities such as arsenic are doped is formed on a semiconductor substrate, and a nitride film is formed in regions where p type pockets are formed on the both sides of a gate electrode. By implementing heat treatment in the atmosphere of oxygen, the portion below the nitride film is placed in the condition where it is equivalent when heat treated in the atmosphere of nitrogen whereby a p type impurity region and an n$^-$ type impurity region are formed. The region except for that below the nitride film is heat treated in the atmosphere of oxygen to form an n$^+$ type impurity region. Further, with the gate electrode as a mask, n$^-$ type impurity region and p type impurity region are formed, thereafter selectively growing a film on the side walls of the gate electrode to form an n$^+$ type impurity region with the gate electrode and the film as masks, thus producing a MOS transistor.

18 Claims, 36 Drawing Figures

METHOD OF PRODUCING SEMICONDUCTOR DEVICE

BACKGROUND OF THE INVENTION

The present invention relates to a method of producing a semiconductor device, and more particularly to a method of producing a MOS transistor of double implanted LDD (Lighty Doped Drain) structure.

A conventional MOS transistor is produced as shown in FIG. 1 wherein the method therefor comprises the steps of forming a gate oxide film 2 on a p type silicon substrate 1, subjecting it to an ion implantation to provide a channel region 3, and thereafter ion implanting arsenic (AS) in self-alignment manner using a gate electrode 4, thereby forming an n+ type drain region 5a and an n+ type source region 5b. However, in the MOS transistor thus formed, an electric field concentrates on a portion of the n+ type drain region 5a in contact with the channel region 3 and hole-electron pairs are produced at the portion. For this reason, there appear phenomena that a substrate current increases so that electrons are injected into the gate electrode 4, resulting in the problem that the operational stability is degraded.

On the other hand, also known is a transistor of LDD (Lighty Doped Drain) structure as shown in FIG. 2 wherein an n⁻ type drain region 6a and an n⁻ type source region 6b are provided in the vicinity of the gate oxide film 2. The transistor provides relaxation of electric field concentration in the vicinity of the drain region 6a. However, even if such LDD transistor is employed, there is a channel region of high concentration. This leads to the drawback that the threshold voltage $V_{th}$ increases due to the back gate bias effect.

To overcome this drawback, as shown in FIG. 3, another type of the transistor of the double implanted LDD structure has been proposed wherein p type regions 7a and 7b are formed below the n⁻ type drain region 6a and the n⁻ type source region 6b. Such double implanted LDD transistor does not require high energy ion implantation for suppressing short channel effect, and therefore there is not any increase in the threshold voltage $V_{th}$ due to the back gate bias effect.

However, where such MOS transistor of double implanted structure is produced to form the n⁻ type region, the p type region and the n+ type region, three ion implantations are required, resulting in the problem that the process becomes complicated.

SUMMARY OF THE INVENTION

An object of the present invention is to provide a method which makes it possible to produce a MOS transistor of double implanted structure with simplified process.

To achieve this object, there is provided a method of producing a semiconductor device comprising the steps of forming a gate oxide film on a semiconductor substrate of a first conductivity type, forming a gate electrode on the gate oxide film, forming a doped oxided film in which impurities of the first conductivity type and impurities of a second conductivity type are doped, forming a nitride film on both side regions of the gate electrode on the doped oxide film, and subjecting it to heat treatment in the atmosphere of oxygen to form, below the nitride film, impurity regions of the first conductivity type and impurity regions of the second conductivity type each having the depth smaller than that of the impurity regions of the first conductivity type and to form, below the doped oxide film except for the nitride film, second impurity regions of the second conductivity type each having an impurity concentration higher than that of the impurity regions of the second conductivity type.

To attain this object, there is further provided a method of producing a semiconductor device comprising the steps of forming a gate oxide film on a semiconductor substrate of a first conductivity type, forming a gate electrode on the gate oxide film, with the gate electrode serving as a mask, ion implanting impurities of the first conductivity type to form impurity regions of the first conductivity type and ion implanting impurities of a second conductivity type to form impurity regions of the second conductivity type having a depth smaller than that of the impurity regions of the first conductivity type, selectively growing a film at least on side walls of the gate electrode, and ion implanting impurities of the second conductivity type with the gate electrode and the film both serving as masks to form second impurity regions of the second conductivity type having an impurity concentration higher than that of the impurity regions of the second conductivity type.

To achieve this object, there is furthermore provided a method of producing a semiconductor device comprising the steps of forming a gate oxide film on a semiconductor substrate of a first conductivity type, forming a gate electrode on the gate oxide film, with the gate electrode serving as a mask, ion implanting impurities of the first conductivity type to form impurity regions of the first conductivity type and ion implanting impurities of the second conductivity type to form impurity regions having the depth smaller than that of the impurity regions of the first conductivity type, forming a high melting point metal layer on the surface of the gate electorde and the impurity regions of the second conductivity type in such a manner that portions on side walls of the gate electrode become thick, ion implanting impurities of the second conductivity type and implementing heat treatment to form a metal compound layer having high melting point on the surface of the impurity regions of the second conductivity type and to form second impurity regions of the second conductivity type having an impurity concentration higher than that of the impurity regions of the second conductivity type in regions except for below the gate electrode and the high melting point metal layer on the side walls of the gate electrode.

BRIEF DESCRIPTION OF THE DRAWINGS

In the accompanying drawings:

FIG. 6 is a flow diagram showing a method of producing a MOS transistor of double implanted LDD structure of the first embodiment according to the present invention;

FIG. 7 is a flow diagram showing a prior art method of producing a transistor of double implanted LDD structure;

FIG. 11 is a flow diagram showing a method of producing a MOS transistor of double implanted LDD structure of a third embodiment according to the present invention;

FIG. 13 is a flow diagram showing a prior art method of producing a MOS transistor of LDD structure;

FIG. 14 is a flow diagram showing a method of producing a MOS transistor of LDD structure of a fourth embodiment according to the present invention.

DETAILED DESCRIPTION OF THE INVENTION

First Embodiment

A first embodiment according to the present invention will be described.

Figure 1:
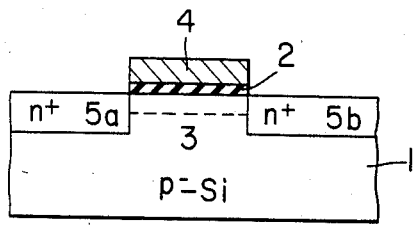
FIG. 1 is a cross sectional view showing a conventional MOS transistor.
Figure 2:
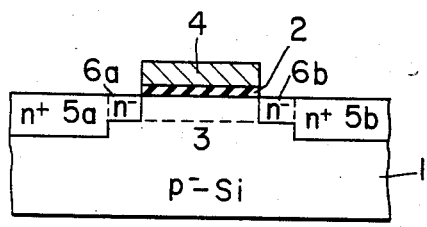
FIG. 2 is a cross sectional view showing a MOS transistor of LDD structure.
Figure 3:
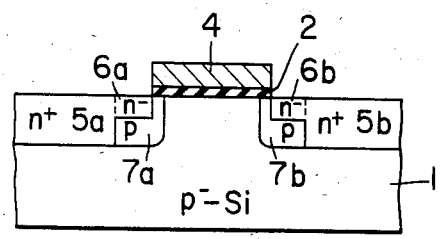
FIG. 3 is a cross sectional view showing a MOS transistor of double implanted LDD structure.
Figure 4:
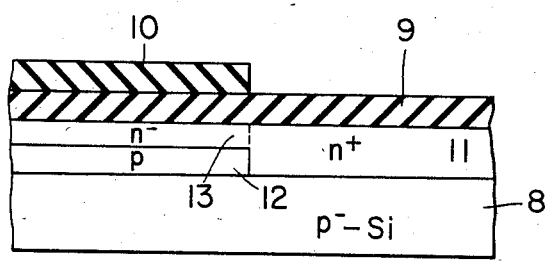
FIG. 4 is an explanatory view for the principle of a first embodiment according to the present invention, respectively.

Prior to the description of the embodiment, the principle of this embodiment will be described with reference to FIGS. 4 and 5. This embodiment utilizes the facts that the diffusion of arsenic (As) which serves as an n type impurity when diffused is promoted in the atmosphere of oxygen and that the diffusion of boron (B) which serves as a p type impurity when diffused is promoted in the atmosphere of nitrogen. As shown in FIG. 4, an oxide film 9 of 0.3 μm thick in which arsenic (As) having a concentration of $10^{21}$ cm$^{-3}$ and boron (B) having a concentration of $10^{18}$ cm$^{-3}$ are doped, is formed on a p− type silicon substrate 8 having a resistivity ρ of 10 to 20 ohm. cm. Then, after a nitride film 10 is formed on the left-hand half of the oxide film 9, diffusion is carried out in the atmosphere of oxygen at a temperature of 1000° C. for half an hour. In this instance, the diffusion in the right-hand half region where the nitride film 10 is not provided is carried out in the atmosphere of oxygen, whereas the diffusion in the left-hand half region is equivalent to the diffusion which is carried out in the atmosphere of nitrogen instead of the atmosphere of oxygen because of the presence of the nitrile film 10.

Figure 5A:
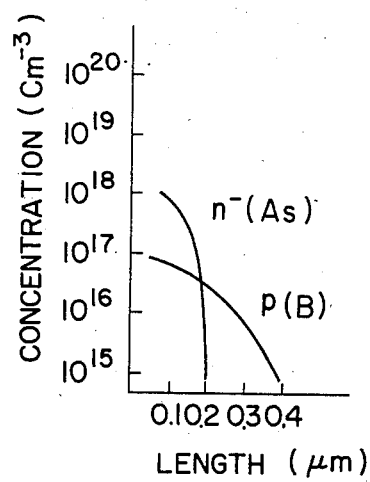
FIG. 5a shows the diffusion of boron (B) and arsenic (As) in the left-hand half region of the embodiment shown in FIG. 4.
Figure 5B:
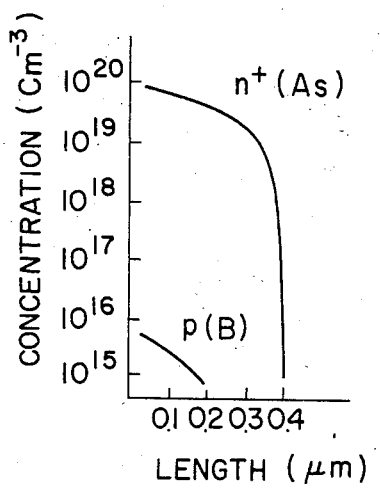
FIG. 5b shows the diffusion of boron (B) and arsenic (As) in the right-hand half region of the embodiment shown in FIG. 4.
Figure 6A:
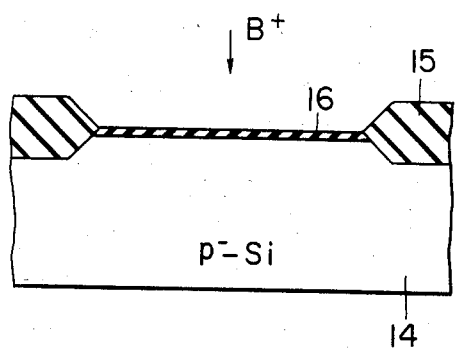
FIG. 6a shows a P-type silicon substrate with a gate oxide film and boron (B) ions implanted in the substrate.
Figure 6B:
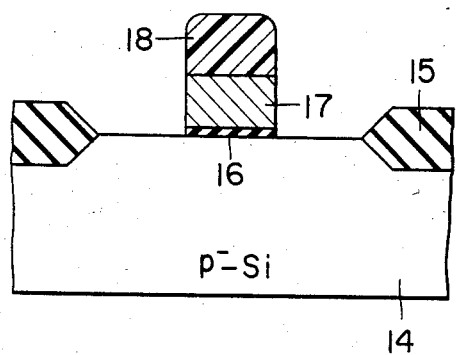
FIG. 6b shows a substrate having a gate electrode formed thereon.
Figure 6C:
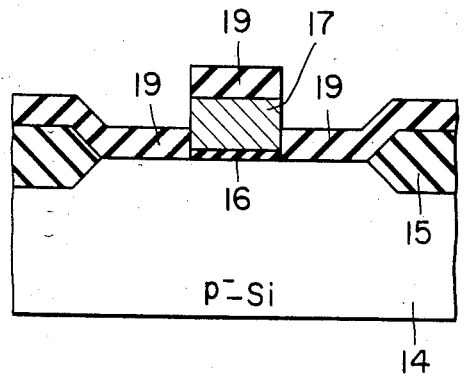
FIG. 6c shows a doped oxide film formed on the gate electrode of the substrate.
Figure 6D:
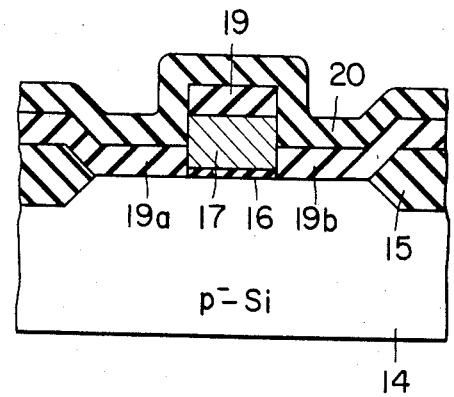
FIG. 6d shows a nitride film deposited of the doped oxide film of the substrate.
Figure 6E:
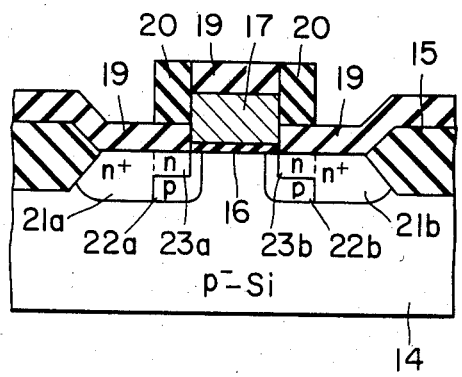
FIG. 6e shows the n, p, and n+ type regions formed in the substrate.
Figure 6F:
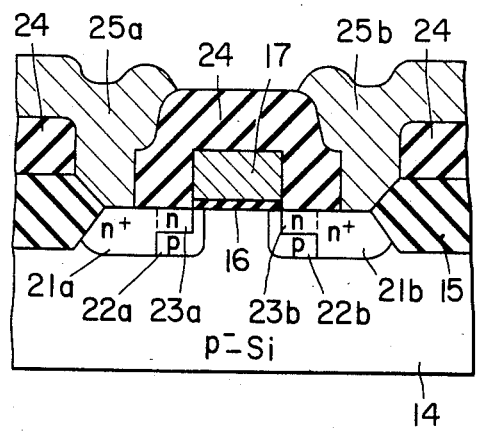
FIG. 6f shows a completed MOS transistor.

Accordingly, in the right-hand half region, as shown in FIG. 5(b), the diffusion of arsenic (As) is promoted to form an n+ type region 11 having a sheet resistance ρs=30 ohm per square and a junction depth of $X_j$=0.4 μm (FIG. 4). In contrast, in the left-hand half region, as shown in FIG. 5(a), the diffusion of boron (B) is further promoted so that the change in the impurity concentration of boron (B) is dominant rather than that of the diffusion of arsenic (As) when the diffusion depth is above approximately 0.15 μm. Thus, an n− type region 13 having a sheet resistance ρs=800 ohm per square and a junction depth $X_j$=0.15 μm and a p type region 12 on the n− type region 13 are formed at the same time.

A method of producing a MOS transistor according to this embodiment will be described with reference to FIG. 6. First a field oxide film 15 having the thickness of 1.2 μm and a gate oxide film 16 having a thickness of 300 Å are formed on a p− type silicon substrate 14 having resistivity of 10 to 20 ohm.cm. Then, boron (B) is ion implanted with the concentration of $2 \times 10^{11}$cm$^{-3}$ at 30 KeV for controlling a threshold voltage $V_{th}$ of the MOS transistor to be produced (FIG. 6(a)). Thereafter, a polycrystalline silicon layer 17 having a sheet resistance $\rho s=30$ ohm per square and the thickness of 0.4 $\mu$m is formed on the gate oxide film 16. A resist film 18 is formed on the polycrystalline silicon layer 17. With the resist film 18 serving as a mask, the polycrystalline silicon layer 17 and the gate oxide film 16 are successively etched by means of reactive ion gas consisting of hydrogen (H$_2$) gas and chloride (Cl$_2$) gas or hydrogen (H$_2$) gas and carbon tetrafluoride (CF$_4$) gas to form a gate electrode 17 having a length of 1.5 $\mu$m and a gate oxide film 16 (FIG. 6(b)). Then, after the resist film 18 is removed, a doped oxide film 19 having a thickness of 0.3 $\mu$m in which arsenic (As) is doped with the concentration of $10^{21}$ cm$^{-3}$ and boron (B) is doped with the concentration of $10^{18}$ cm$^{-3}$ is formed on the gate electrode 17 by the sputtering method. Thereafter, the silicon substrate 14 is immersed into ammonium fluoride (NH$_4$F) for ten seconds to remove the doped oxide film 19 formed on the side walls of double layer structure comprising the gate oxide film 16 and the gate electrode 17 wherein the remaining doped oxide film 19 having the thickness of 0.25 $\mu$m is left on its flat portion (FIG. 6(c)). Then, a nitride film 20 having a thickness of 0.25 $\mu$m is deposited thereon by LPCVD (Low Pressure Chemical Vapor Deposition) (FIG. 6(d)). Then, the nitride film 20 provided on the flat portion is removed by etching in the presence of reactive ion gas containing hydrogen (H$_2$) gas and carbon tetrafluoride (CF$_4$) gas. The nitride film 20 is left only on the side walls of double layer structure. Thus, the present embodiment provides the advantage that the nitride film 20 can be left only in areas where p type pockets are to be formed. Then, the article is heat treated in the atmosphere of oxygen at a temperature of 1000° C. for half an hour to form at the same time an n+ type drain and source regions 21a and 21b having a sheet resistance $\rho s=30$ ohm per square and a junction depth $X_j=0.4$ $\mu$m, n− type drain and source regions 23a and 23b having a sheet resistance $\rho s=800$ ohm per square and a junction depth $X_j=0.15$ $\mu$m (FIG. 6(e)) and p type pocket regions 22a and 22b under the n− type drain and source regions 23a and 23b. Then, the remaining nitride film 20 and the doped oxide film 19 are removed by etching in the presence of reactive gas containing hydrogen gas (H$_2$) and carbon tetrafluoride (CF$_4$). Thereafter, a CVD oxide film 24 having a thickness of 1.0 $\mu$m is deposited thereon to provide an opening or a window. Finally, a drain electrode 25a and a source electrode 25b are formed by means of a conductive material, thus forming a MOS transistor (FIG. 6(f)).

According to this embodiment, the nitride film can be formed by self-alignment without patterning and the p type region, n− type region and n+ type region can be formed by implementing diffusion once, thereby accomplishing the simplification of the production process to great extent.

In this embodiment, the nitride film was formed by self-alignment, but may be formed by patterning. In this instance, the pocket portions can be formed in a desired form. In this embodiment, reactive ion etching method was used for etching and spattering method or CVD method was used for stacking, but other methods may be used for etching and stacking.

As stated above, the present embodiment makes it possible to form at the same time the p type region, the n− type region and the n+ type region by single diffusion process, resulting in the possibility that the processes are simplified to great extent. The MOS transistor produced by such producing method has improved LDD structure, thereby enabling to considerably improve reliability and to suppress the increment ($\Delta V_{th}$) in the threshold voltage $V_{th}$ to be less than 1 V e.g. at the back gate bias voltage of 10 V.

Second Embodiment

Figure 7A:
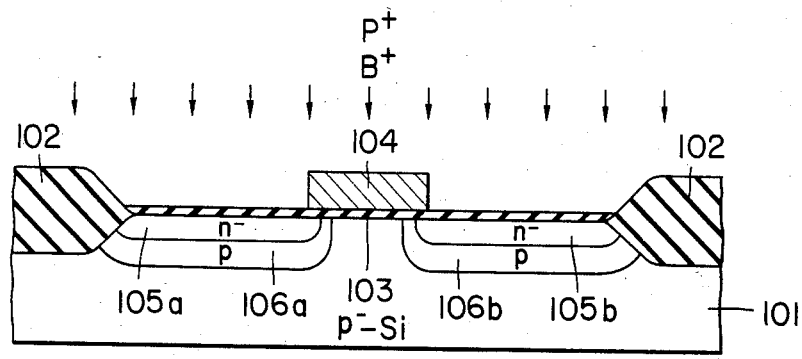
FIG. 7a shows a p-type silicon substrate having n- and p-type impurity regions.

A second embodiment according to the present invention will be described. Proceeding with the description on the second embodiment, a prior art method of producing a MOS transistor of double implanted structure (e.g., S. Ogura et al, "A half micron MOSFET using double implanted LDD" International Electron Device Meeting Technical Digest 718 (1982)) will be described with reference to FIG. 7.

First, after a field oxide film 102 is formed on the surface of e.g. a p type silicon substrate 101, a gate oxide film 103 is formed on the surface of the substrate 101 surrounded by the field oxide film 102. Then, after a polycrystalline silicon film is stacked on the whole surface, the patterning is implemented to form a gate electrode 104. Then, with the gate electrode 104 serving as a mask, n type impurities are ion implanted to form shallow n− type impurity regions 105a and 105b which form parts of source and drain regions, respectively. Then, with the gate electrode 104 using as a mask, p type impurities are ion implanted to form p type impurity regions 106a and 106b which serve as p type pockets (FIG. 7(a)).

Figure 7B:
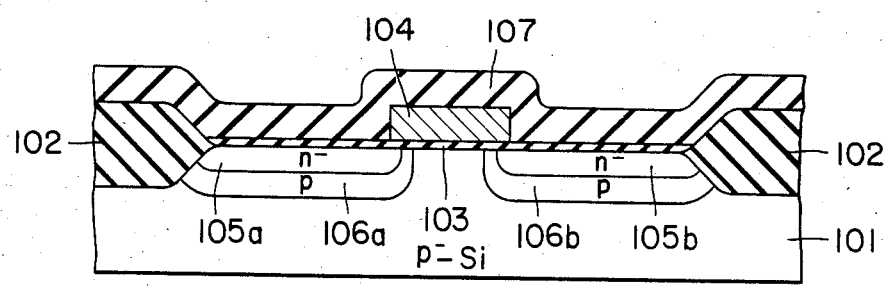
FIG. 7b shows an oxide film deposited onto a substrate.

Then, a CVD oxide film 107 is stacked on the whole surface (FIG. 7(b)), and thereafter the CVD oxide film 107 is etched by anisotropic dry etching, thus leaving CVD oxide films 107'a and 107'b on the side walls of the gate electrode 104. Then, with the gate electrode 104 and the remaining CVD oxide films 107'a and 107'b serving as masks, n type impurities are ion implanted to form deep n+ type impurity regions 108a and 108b. There are thus formed source and drain regions 109 and 110 comprising shallow n− type impurity regions 105a and 105b provided in the vicinity of the channel region and deep n+ type impurity regions 108a and 108b adjacent to these regions, and p type impurity regions (pocket regions) 106a and 106b located below the shallow n− type impurity regions 105a and 105b provided in the vicinity of the channel regions (FIG. 7(c)).

Figure 7C:
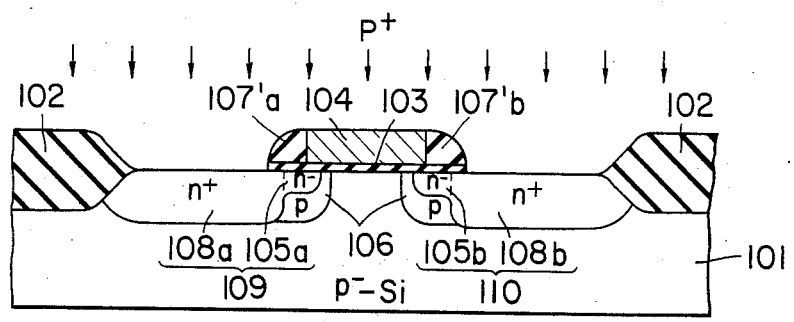
FIG. 7c shows a completed MOS transistor.

The MOS transistor shown in FIG. 7(c) can reduce the short channel effect due to the presence of p type impurity regions (pocket regions) 106a and 106b, and also prevent the withstand voltage of the drain from being lowered due to the presence of shallow n− type impurity regions 105a and 105b above the p type impurity regions (pocket regions) 106a and 106b, thereby reducing the occurrence of hot carriers. Further, the MOS transistor shown in FIG. 7(c) makes it possible to lower the impurity concentration of the channel region to the extent that the concentration in the channel region is equal to the concentration due to the ion implantation ordinarily practiced, thereby to improve the subthreshold characteristic and the substrate bias characteristic.

However, with this method, it is difficult to control the dimensions of CVD oxide films 107'a and 107'b which are left on the side walls of the gate electrode 104 in the process shown in FIG. 7(c). Namely, the dimension accuracy of the CVD oxide films 107'a and 107'b is affected by the film thickness of the CVD oxide film 107, the etching speed for the CVD oxide film 107, the uniformity of the etching speed, the withdrawal of the oxide film due to surface treatment before and after etching, etc., resulting in lowering of dimension controllability. Particularly, as the diameter of wafers becomes large, there is a tendency that the variation in the thickness of the CVD oxide film 107 on the wafer surface increases, and the distribution of the etching speed in the wafer surface at the time of anisotropic etching is further dispersed. Accordingly, when the dimensions of the CVD oxide films 107'a and 107'b to be left are too large, the resistances of the n⁻ type impurity regions 105a and 105b become larger than required, thus lowering current amplification ratio. Contrary to this, when the dimensions of the CVD oxide films 107'a and 107'b to be left are too small, the widths of the n⁻ type impurity regions 105a and 105b become small, resulting in insufficient effect for suppressing the lowering of the drain withstand voltage.

Further, since the anisotropic dry etching is used, it is likely that a damage layer on the surface of the substrate 101 at the time of etching occurs, or polymers are stacked on the substrate 101 due to the reaction of the gas used (e.g. $CF_4$), thus providing the causes to degrade the element characteristics.

The second embodiment contemplates the elimination of the above-mentioned drawbacks with the prior art method, and will be described with reference to FIG. 8.

First, a field oxide film 112 of 1.2 $\mu$m thick is formed on the surface of a p type silicon substrate 111 having the resistivity of 10 to 20 ohm.cm, and thereafter a gate oxide film 113 of 250 Å thick is formed on the surface of the substrate 111 surrounded by the field oxide film 112. Then, boron ions ($B^+$) are ion implanted in the conditions where the accelerating energy is 25 KeV and the dose quantity is $9 \times 10^{11}$ cm$^{-2}$. Followed by this, after a polycrystalline silicon film having the thickness of 0.4 $\mu$m and the sheet resistance $\rho s = 20$ ohm per square is stacked on the whole surface, patterning is implemented by photolithographic method to form a gate electrode 114. Then, with the gate electrode 114 serving as a mask, phosphorus (P) is ion implanted in the condition where the accelerating energy is 80 KeV and the dose quantity is $5 \times 10^{13}$ cm$^{-2}$ to form shallow n⁻ type impurity regions 115a and 115b which partially forms the source and the drain. Further, with the gate electrode 114 as a mask, boron (B) is ion implanted under the conditions of the accelerating energy of 80 KeV and the dose quantity of $5 \times 10^{12}$ cm$^{-2}$ to form p type impurity regions 116a and 116b which serve as pocket regions (FIG. 8(a)).

Then, after anneal is carried out at a temperature of 950° C. for twenty minutes in the presence of nitrogen ($N_2$), the surface is rinsed. Thereafter, by using $WF_6$, gas vapor growth is carried out in the conditions where flow volume is 6 cc/mm, the vacuum pressure is $1-3 \times 10^{-4}$ Torr and the temperature is 350° C. As a result, a tungsten film 117 having the thickness of 0.3 $\mu$m only on the surface of the gate electrode 114 is selectively formed. In this instance, the tungsten film 117 is not formed on the insulating film except for the gate electrode 114 of the polycrystalline silicon (FIG. 8(b)) (T. Moriya et al, "A PLANAR METALLIZATION PROCESS-ITS APPLICATION TO TRI-LEVEL ALUMINUM INTERCONNECTION" International Electron Devices Meeting Technical Digest 500 (1983)).

Then, with the gate electrode 114 and the tungsten film 117 as masks, phosphorus is ion implanted under the conditions of the accelerating energy of 100 KeV and the dose quantity of $3 \times 10^{15}$ cm$^{-2}$ to form deep n⁺ type impurity regions 118a and 118b serving as the source and the drain, respectively. There are thus formed source and drain regions 119 and 120 comprising shallow n⁻ type impurity regions 115a and 115b provided in the vicinity of the channel region and n⁺ type impurity regions 118a and 118b adjacent to these regions, and p type impurity regions (pocket regions) 116a and 116b (boron concentration is $1 \times 10^{16}$ to $5 \times 10^{17}$ cm$^{-3}$) located below the n⁻ type impurity regions 115a and 115b provided in the vicinity of the channel regions (FIG. 8(c)).

Then, after the tungusten film 117 is removed, a CVD oxide film 121 is stacked on the whole surface and then anneal is carried out, thereafter opening contact holes. Then, after aluminum (Al) film is vapor-deposited on the whole surface, patterning is implemented to form Al wirings 122a and 122b. Thus, the n-channel MOS transistor is produced (FIG. 8(d)).

Figure 8A:
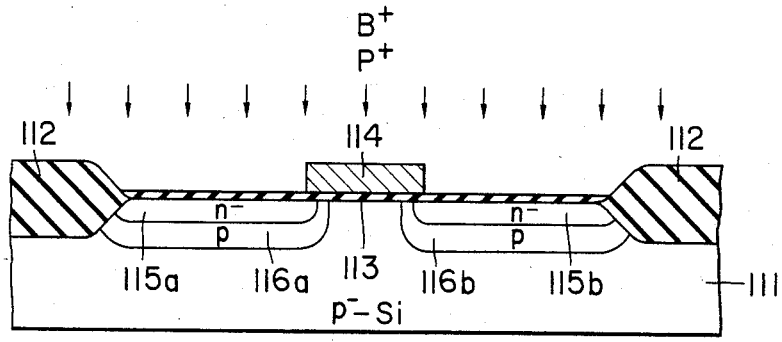
FIG. 8a shows a p-type silicon substrate having n− and p-type impurity regions.
Figure 8B:
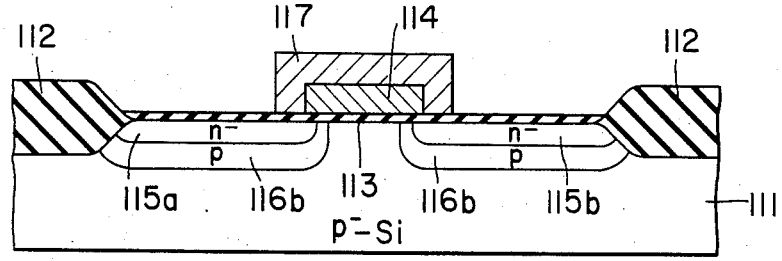
FIG. 8b shows a tungsten film deposited on the gate electrode of a substrate.
Figure 8C:
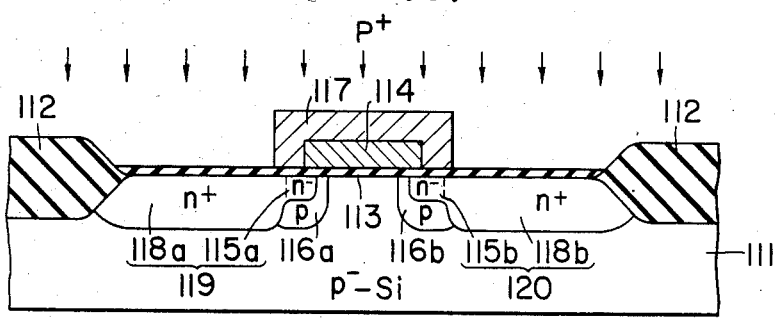
FIG. 8 is a flow diagram showing a method of producing a MOS transistor of double implanted LDD structure of a second embodiment according to the present invention.
FIG. 8d shows a completed n-channel MOS transistor.

Thus, with the above-mentioned method, the dimensions of the n⁻ type impurity regions 115a and 115b and the p type impurity regions (pocket regions) 116a and 116b are determined depending upon only the thickness of the tungusten film 117 which is selectively grown on the surface of the gate electrode 114 in the process shown in FIG. 8(b), resulting in extremely good controllability of dimension. Accordingly, this can effectively prevent the short-channel effect or the lowering of the drain withstand voltage. Further, as compared to the prior art method in which insulating films are left on the side walls of a gate electrode by vapor-growth method and anisotropic etching, the present method enables to simplify the process. Furthermore, the present method does not employ anisotropic dry etching, and therefore there is no possibility that a damage layer is formed on the surface of the substrate and that there occurs the degradation of the element characteristics due to the stacking of polymers.

In the embodiment, the phosphorus ion implantation for forming the n⁻ type impurity region 115 and the boron ion implantation for forming the p type impurity region 116 were carried out after the gate electrode 114 was formed in the process shown in FIG. 8(a). However, these ion implantations may be effected after the tungusten film 117 is removed in the process shown in FIG. 8(d).

Figure 8D:
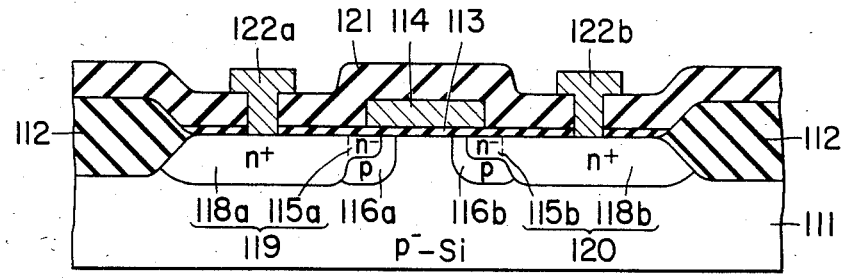
Figure 9:
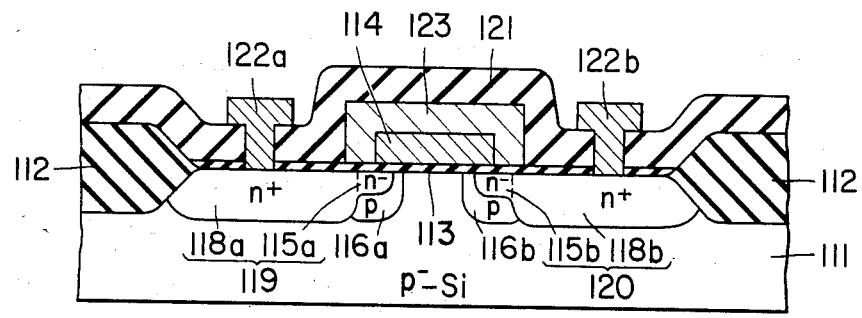
FIGS. 9 and 10 are cross sectional views showing a MOS transistor produced by a modified producing method of the second embodiment according to the present invention, respectively.

Further, in the embodiment, the tungsten film 117 was removed in the process shown in FIG. 8(d), but the tungsten film 117 may not be removed. In this instance, as shown in FIG. 9, the tungsten film 117 reacts with the polycrystalline silicon constituting the gate electrode 114 at the time when the anneal is implemented, thereby forming a tungsten silicide film 123 on the surface of the gate electrode 114. As stated above, by forming the tungsten silicide film 123 on the surface of the gate electrode 114, it is possible that the resistance of the gate electrode (wiring) becomes low.

Figure 10:
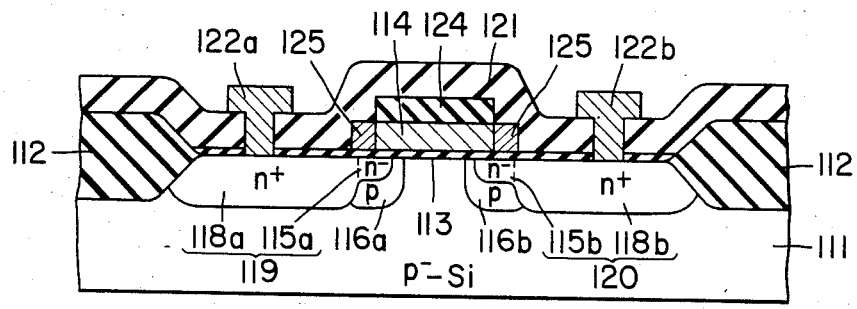

Further, in the above-mentioned embodiment, the tungsten film 117 was selectively grown not only on the side walls of the gate electrode 114 and the upper surface thereof in the process shown in FIG. 8(b). If an insulating film (e.g. a CVD oxide film) is formed on the gate electrode 114 in a process corresponding to the process shown in FIG. 8(a), the tungsten film will be selectively grown soley on the side walls of the gate electrode 114 in the process corresponding to the process shown in FIG. 8(b). The structure thus obtained is shown in FIG. 10 wherein an insulating film, e.g. a CVD oxide film 124 is formed on the gate electrode 114 and e.g. tungsten silicide films 125a and 125b are formed on the side walls of the gate electrode 114.

Furthermore, it has been described that the gate electrode is formed by the polycrystalline silicon and the tungsten film is used as a coating film. The present embodiment is not limited to this, and therefore the gate electrode may be metal e.g. molybdenum (Mo), and the coating film may be metal e.g. molybdenum (Mo), metal semiconductor compound or semiconductor e.g. $MoSi_2$, $TaSi_2$, $WSi_2$ or $TiSi_2$, etc. Further, it is needless to say that the present embodiment is not limited to the n-channel MOS transistor and is applicable to the p-channel MOS transistor.

As stated above in detail, the method of producing a semiconductor device according to the second embodiment makes it possible to produce a semiconductor device, by means of extremely controllable and very simplified process, which can effectively prevent short channel effect due to fining or densification of the element etc.

Third Embodiment

A third embodiment according to the present invention will be described with reference to FIG. 11.

First, a gate electrode 223 of polycrystalline silicon of 0.35 μm thick in which n type impurities are doped is formed on a p$^-$ type silicon substrate 221 having a resistivity of 10 to 20 ohm.cm through a gate oxide film 222 of 500 Å thick. Then, with the gate electrode 223 as a mask, n type impurities e.g. arsenic (As) are ion implanted into the substrate 221 under conditions of an accelerating voltage of 40 KeV and a dose quantity of $1 \times 10^3$ cm$^{-2}$. Further, p type impurities e.g. boron (B) are ion implanted into the substrate 221 in the conditions where an accelerating voltage is 80 KeV and a dose quantity is $4 \times 10^{12}$ cm$^{-2}$. Thus, an ion implanted layer 224 is formed (FIG. 11(a)).

Then, heat treatment is carried out in the atmosphere of oxygen at 1000° C. As a result, the ion implanted layer 224 is activated, so that there are formed n$^-$ type impurity regions 225a and 225b having a resistivity of 1.2K ohm per square and a depth of 0.2 μm and p type impurity regions 241a and 241b impurity concentration of $1 \times 10^{16}$ to $5 \times 10^{17}$ cm$^{-3}$ which are deeper than the impurity regions 225a and 225b. At this time, a thin oxide film 226 of 200 Å thick is formed on the surface of the substrate 221 and a thin oxide film 227 of 500 Å thick is formed around the gate electrode 223 (FIG. 11(a)). This is because there is difference between the oxidation rate of the monocrystalline silicon which forms the substrate 221 and that of the polycrystalline silicon which forms the gate electrode 223. Thereafter, the oxide films 226 and 227 are removed by means of RIE (Reaction Ion Etching) until the substrate 221 is exposed to the surface. As a result, the oxide film 227 having a thickness of 300 Å is left only around the gate electrode 223. Further, a platinum (Pt) layer 228 having a thickness of 1000 Å is formed on the whole surface by sputtering vapor-deposition method. In this instance, the thickness of the platinum layer 228 formed on side walls of the gate electrode 223 is 5000 Å. Thereafter, arsenic (As) is ion implanted into the platinum layer 228 in the conditions where the accelerating voltage is 500 KeV and the dose quantity is $3 \times 10^{15}$ cm$^{-2}$ (FIG. 11(e)).

Then, heat treatment is implemented at a temperature of 600° C. in the atmosphere of nitrogen (N$_2$). As a result, a PtSi layer 229 having a thickness of 1000 Å is formed on the surface of the above-mentioned n$^-$ type impurity regions 225a and 225b, and arsenic in the vicinity of the interface between the platinum layer 228 and the substrate 221 is diffused into the substrate 221 to form n$^+$ type impurity regions 230a and 230b having a resistivity of 70 ohm per square and a depth of 0.2 μm. An n type source region 231 with a p type pocket is constituted by the n$^-$ type impurity region 225a, the p type impurity region 241a and the n$^+$ type impurity region 230a, and an n type drain region 232 with a p type pocket is constituted by the n$^-$ type impurity region 225b, the p type impurity region 241b and the n$^+$ type impurity region 230b (FIG. 11(d)). Then, the remaining platinum layer 228 is removed with aqua regia. Further, a CVD film 233 having a thickness of 0.5 μm is stacked on the whole surface, and then portions corresponding to parts of source and drain regions 231 and 232, respectively, are selectively removed to form contact holes 234a and 234b. Thereafter, lead electrodes 236a and 236b are formed on these contact holes 234a and 234b, respectively, to produce a MOS transistor of LDD structure (FIG. 11(e)).

Thus, the third embodiment according to the present invention provides the following advantages.

(1) With the gate electrode 223 as a mask, arsenic is ion implanted into the substrate 221, thereby to form n$^-$ type impurity regions 225a and 225b and the p type impurity regions 241a and 241b. Accordingly, these impurity regions can be formed in a self-alignment manner. Further, heat treatment is carried out in the atmosphere of N$_2$ with the platinum layer 228 on the sidewalls of the gate electrode 223 being thick, and therefore the n$^+$ type impurity regions 230a and 230b can be formed in a self alignment manner on the surface of the substreat 221 except for the thick portion (near the gate electrode) of the platinum layer 228. Accordingly, this means that it is possible to form, in a self-alignment manner, the source region 231 with a p type pocket comprising the impurity regions 225a, 230a and 241a and the drain region 232 with a p type pocket comprising impurity regions 225b, 230b and 241b.

(2) Since the PtSi layer 229 is formed on the surface of the source and drain regions 231 and 232, it is possible to reduce the resistance of these source and drain regions.

(3) The platinum layer 228 is formed and then arsenic is implanted into the substrate and the interface, thereafter to effect heat treatment at a low temperature of 600° C. in the atmosphere of N$_2$, thereby diffusing arsenic near the interface between the platinum layer 228 and the substrate 221, thus enabling to form the n$^+$ type inpurity regions 230a and 230b. Further, the present embodiment can make each length (L) of the n$^-$ type impurity regions 225a and 225b, and the p type impurity regions 241a and 241b substantially equal to the designed value. This allows the substantial channel length to be equal to the designed value. Thus, the present embodiment suppresses electric field concentration which was unavailable phenomenon with the prior art method and prevents occurrence of hot electrons, thus improving the reliability of the element.

Figure 11A:
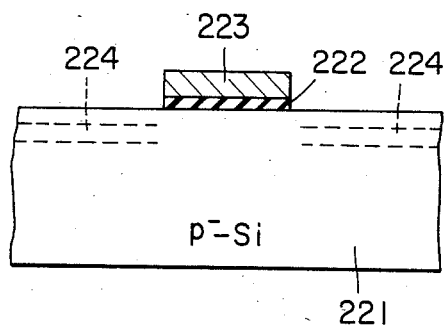
FIG. 11a shows a p− silicon substrate having an ion implanted layer.
Figure 11D:
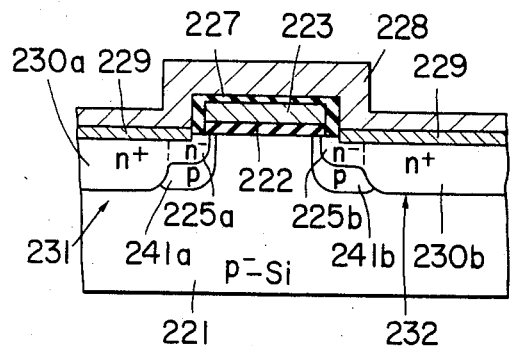
FIG. 11d shows a PtFi layer formed on the surface of m-type impurity region of the substrate.
Figure 11B:
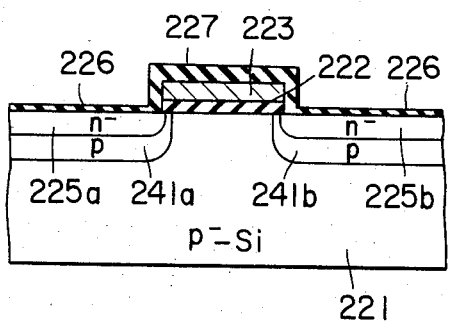
FIG. 11b shows a substrate having an oxide film around a gate electrode.
Figure 11E:
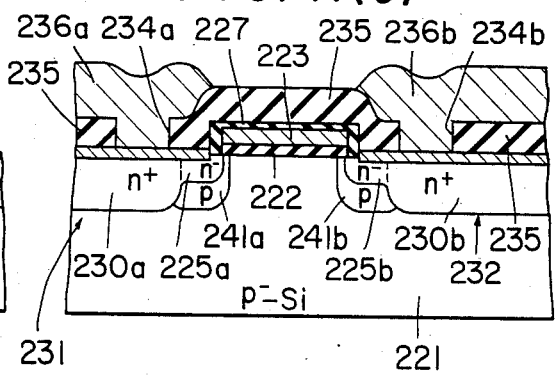
FIG. 11e shows a lightly doped drain structure MOS transistor.
Figure 11C:
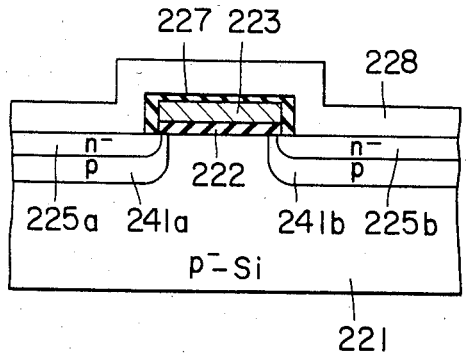
FIG. 11c shows a platinum layer formed on the surface of a substrate by sputtering vapor-deposition method.

(4) The oxide film 227 is formed around the gate electrode 223 and on the substrate 221 in the process shown in FIG. 11(b), thereafter to leave the oxide film 227 only around the gate electrode 223 by means of RIE. Accordingly, this completely prevents short-circuit between the PtSi layer and the gate electrode 223 in the subsequent process.

Figure 12:
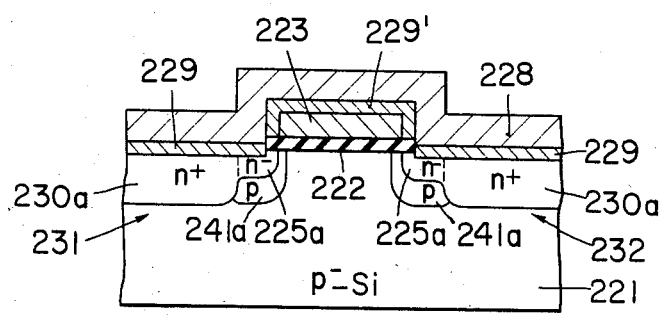
FIG. 12 is a cross sectional view showing a MOS transistor produced by a modified producing method of the third embodiment according to the present invention.

FIG. 12 shows a modification of the present embodiment wherein a PtSi layer 229' is formed on the surface of the gate electrode 223 with the oxide film not being left around the gate electrode 223, thus reducing the resistance of the gate electrode 223.

In this embodiment, the platinum layer was used as a metal layer. However, this embodiment is not limited to this, and e.g. a molybdenum layer, a titanium layer or a pallagium layer may be used. Further, in this embodiment, arsenic was used as an n type impurity. However, this embodiment can be instead practiced using antimony.

As described in detail, the third embodiment of the invention can provide a method of producing a semiconductor device, e.g. a highly reliable MOS transistor of LDD structure with a p type pocket, which makes it possible to form the source and drain regions in a self-alignment manner, allow these regions to have low resistance and eliminate the problems due to hot electrons.

Fourth Embodiment

Figure 13A:
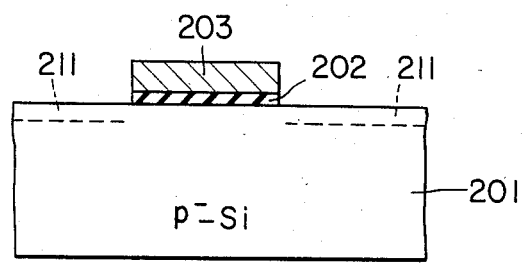
FIG. 13a shows a p− silicon substrate having an ion implanted layer.
Figure 13B:
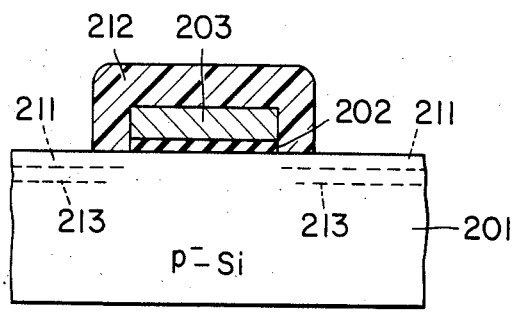
FIG. 13b shows a p− type silicon substrate having two ion implanted layers of differing consentration.
Figure 13C:
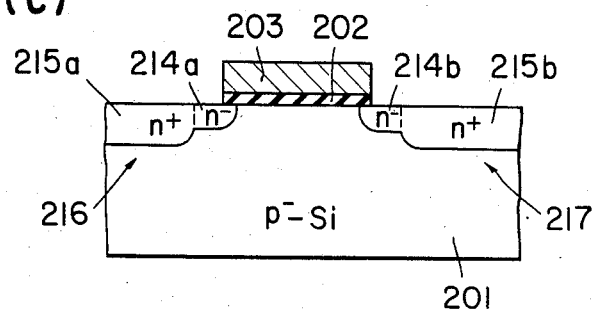
FIG. 13c shows a completed lightly doped drain structure MOS transistor.

A fourth embodiment according to the present invention will be described and the fourth embodiment is directed to a method of producing a MOS transistor of LDD structure. Prior to the description on this embodiment, an example of the prior art method will be described with reference to FIG. 13.

First, a gate electrode 203 is formed on a p$^-$ type silicon substrate 201 through a gate oxide film 202 by patterning. Then, with the gate electrode 203 as a mask, arsenic is ion implanted into the substrate 201 at a small dose quantity to form a first ion implanted layer 211 (FIG. 13(a)). Then, a resist film 212 is formed so as to cover the gate electrode 203, and thereafter with the resist film 212 as a mask, e.g. arsenic is ion implanted into the substrate 201 at a high dose quantity to form a second ion implanted layer 213 (FIG. 13(b)). Further, after the resist film 212 around the gate electrode 203 is removed, heat treatment is implemented. As a result, the ion implanted layers 211 and 212 are respectively activated, so that there is formed an n type source region 216 comprising a shallow n$^-$ type impurity region 214a in the vicinity of the gate electrode 203 and a deep n$^+$ type impurity region 215a remote from the gate electrode 203 and adjacent to the impurity region 214a. Similarly, an n type drain region 217 is formed by the shallow n$^-$ type impurity region 214b and the deep n type impurity region 215b. Thus, a MOS transistor of LDD structure is produced (FIG. 13(c)). However, the drawbacks of the above-mentioned prior art method are to further require one additional lithographic process as compared to the MOS process, resulting in complicated processes.

The fourth embodiment of the invention contemplates elimination of drawbacks of the above-mentioned prior art method and will be described with reference to FIG. 14.

First, there is formed a gate electrode 223 of polycrystalline silicon having a thickness of 0.35 $\mu$m in which n type impurities are doped on a p$^-$ type silicon substrate 221 having a resistivity of 10 to 20 ohm.cm through a gate oxide film 222 having a thickness of 500 Å. Then, with the gate electrode 223 as a mask, arsenic is ion implanted into the substrate 221 in the conditions where the accelerating voltage is 40 KeV and the dose quantity is $1 \times 10^{13}$ cm$^{-2}$ to form an ion implanted layer 224 (FIG. 14(a)). Then, heat treatment is implemented at a temperature of 1000° C. in the atmosphere of oxygen. As a result, the ion implanted layer 224 is activated, whereby the n$^-$ type impurity regions 225a and 225b having a resistivity of 1.2K ohm per square and a depth of 0.2 $\mu$m are formed. At this time, an oxide film 226 having a thickness of 200 Å is formed on the surface of the substrate 221, and an oxide film 227 having a thickness of 500 Å is formed around the gate electrode 223 (FIG. 14(b)) Thereafter, the oxide films 226 and 227 are removed e.g. by RIE until the substrate 221 is exposed. As a result, the oxide film 227 having a thickness of 300 Å is left only around the gate electrode 223. Further, a platinum layer 228 having a thickness of 1000 Å is formed. In this instance, the thickness of the platinum layer 228 on the side walls of the gate electrode 223 is 500 Å. Thereafter, arsenic is ion implanted in the conditions where the accelerating voltage is 500 KeV and the dose quantity is $3 \times 10^{15}$ cm$^{-2}$ (FIG. 14(c)).

Then, heat treatment is implemented at a temperature of 600° C. in the atmosphere of N$_2$. As a result, a PtSi layer 229 having a thickness of 1000 Å is formed on the surfaces of the impurity regions 225a and 225b, and arsenic in the vicinity of the interface between the platinum layer 228 and the substrate 221 is diffused into the substrate 221 to form impurity regions 230a and 230b having a resistivity of 70 ohm per square and a depth of 0.2 $\mu$m. An n type source region 231 is constituted by the n$^-$ type impurity region 225a and the n$^+$ type impurity region 230a, and an n type drain region 232 is constituted by the n$^-$ type impurity region 225b and the n type impurity region 230b (FIG. 14(d)). Thereafter, the remaining platinum layer 228 is removed by aqua regia. Further, a CVD film 223 having a thickness of 0.5 $\mu$m is stacked on the whole surface and then portions corresponding to parts of the source and drain regions 231 and 232, respectively, are selectively removed, thereby forming contact holes 234a and 234b. Thereafter, lead electrodes 236a and 236b are formed on the contact holes 234a and 234b. Thus, a MOS transistor of LDD structure is produced (FIG. 14(e)).

The fourth embodiment provides the same advantages as those of the above mentioned third embodiment.

Figure 15:
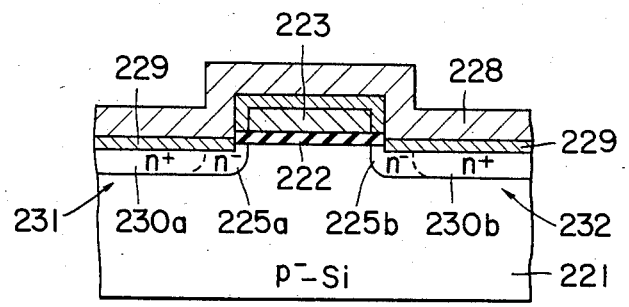
FIG. 15 is a cross sectional view showing a MOS transistor produced by a modified producing method of the fourth embodiment according to the present invention.
Figure 14A:
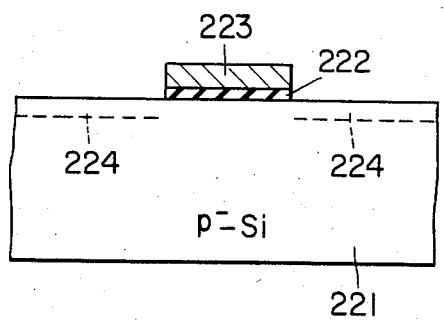
FIG. 14a shows a p− type silicon substrate having an ion implanted layer.
Figure 14D:
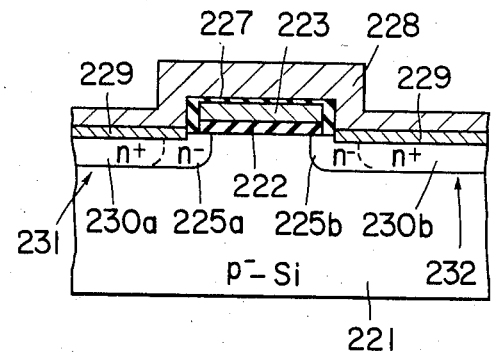
FIG. 14d shows a substrate having n+ type and n− type impurity regions constituting source and drain regions of a substrate.
Figure 14B:
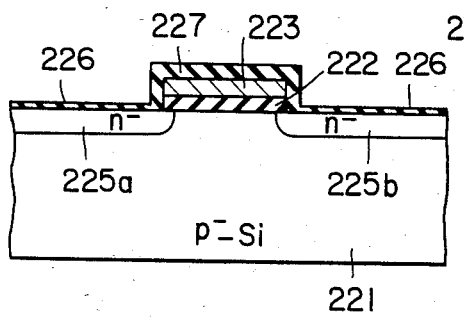
FIG. 14b shows a p− type silicon substrate having an oxide film formed around a gate electrode and having n− type impurity regions.
Figure 14E:
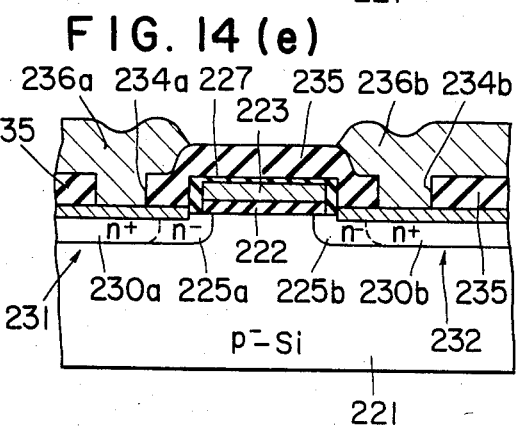
FIG. 14e shows a completed lightly doped drain structure MOS transistor.
Figure 14C:
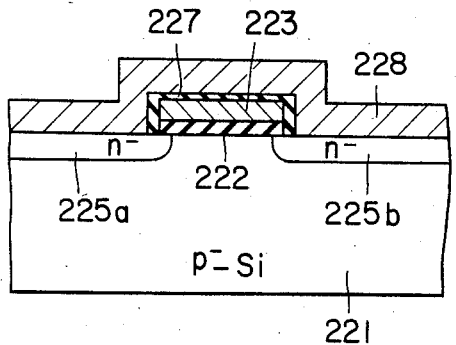
FIG. 14c shows a substrate having an oxide film formed only around a gate electrode.

FIG. 15 shows a modification of the fourth embodiment wherein a PtSi layer 229' is formed on the surface of the gate electrode 223 with the oxide film being not left around the gate electrode 223, thus allowing the resistance of the gate electrode 223 to be low.

In the above-mentioned embodiment, the platinum layer was used as a metal layer having high melting point. However, the present embodiment can be instead practiced e.g. using a molybdenum layer, a titanium layer or a pallagium layer.

Further, in the above-mentioned embodiment, arsenic was used as an n type impurity. However, the present embodiment may be instead practiced e.g. using antimony.

As stated above, the present embodiment can provide a method of producing a highly reliable semiconductor device, e.g. MOS transistor, etc. of LDD structure, which makes it possible to form the source and drain regions in a self-alignment manner, reduce the resistance of these source and drain regions, and eliminate the drawbacks due to hot electrons.

What is claimed is:

1. A method of producing a semiconductor device comprising the steps of:
   (a) forming a gate oxide film on a semiconductor substrate of a first conductivity type;
   (b) forming a gate electrode on said gate
   (c) forming a doped oxide film in which impurities of the first conductivity type and impurities of a second conductivity type are doped on said semiconductor substrate;
   (d) forming a nitride film on the both side regions of the gate electrode on said doped oxide film; and
   (e) implementing heat treatment in the atmosphere of oxygen to form impurity regions of the first conductivity type in a region below said nitride film and impurity regions of the second conductivity type having a depth smaller than that of said impurity regions of the first conductivity type, and to form second impurity regions of the second conductivity type having an impurity concentration larger than that of said impurity regions of the second conductivity type.

2. A method according to claim 1, wherein said impurity of the first conductivity type is boron and said impurity of the second conductivity type is arsenic.

3. A method according to claim 1, wherein said step of forming said doped oxide film comprises the steps of stacking said doped oxide film on said semiconductor substrate by sputtering method, and removing said doped oxide film on the side walls of said gate oxide film and said gate electrode.

4. A method according to claim 1, wherein said step of forming said nitride film comprises the steps of forming a nitride film on said doped oxide film and on the side walls of said gate electrode, and etching said nitride film by reactive ion etching to leave said nitride film only on the side walls of said gate electrode.

5. A method according to claim 2, wherein said step of forming said nitride film comprises the steps of forming a nitride film on said doped oxide film and on the side walls of said gate electrode, and etching said nitride film by reactive ion etching method to leave said nitride film only on the side walls of said gate electrode.

6. A method of producing a semiconductor device comprising the steps of:
   (a) forming a gate oxide film on a semiconductor substrate of a first conductivity type;
   (b) forming a gate electrode on said gate oxide film;
   (c) ion implanting impurities of the first conductivity type using said gate electrode as a mask to form impurity regions of the first conductivity type and ion implanting impurities of a second conductivity type using said gate electrode as a mask to form impurity regions of the second conductivity type having a depth smaller than that of said impurity regions of the first conductivity type;
   (d) selectively growing a film at least on side walls of said gate electrode; and
   (e) ion implanting impurities of the second conductivity type using said gate electrode and said film as masks to form second impurity regions having an impurity concentration higher than that of said impurity regions of the second conductivity type.

7. A method according to claim 6, wherein said gate electrode is made of polycrystalline silicon and said film comprises a metal film having high melting point.

8. A method according to claim 7, which further comprises the step of heating said gate electrode and said film to form silicate metal film having high melting point on the surface of said gate electrode.

9. A method according to claim 6, wherein said impurity of the first conductivity type is boron, and said impurity of the second conductivity type is arsenic.

10. A method of producing a semiconductor device comprising the steps of:
    (a) forming a gate oxide film on a semiconductor substrate of a first conductivity type;
    (b) forming a gate electrode on said gate oxide film;
    (c) selectively growing a film at least on side walls of said gate electrode;
    (d) ion implanting impurities of a second conductivity type using said gate electrode and said film as masks to form impurity regions of the second conductivity type;
    (e) removing said film; and
    (f) ion implating impurities of the first conductivity type using said gate electrode as a mask to form impurity regions of the first conductivity type and ion implanting impurities of the second conductivity type using said gate electrode as a mask to form second impurity regions of the second conductivity type having an impurity concentration lower than that of said impurity regions of the first conductivity type.

11. A method according to claim 10, wherein said gate electrode is made of polycrystalline silicon and said film is a metal film having high melting point.

12. A method according to claim 10, which further comprises the step of heating said gate electrode and said film to form a silicate metal film having high melting point on the surface of said gate electrode.

13. A method according to claim 10, wherein said impurity of the first conductivity type is boron and said impurity of the second conductivity type is arsenic.

14. A method of producing a semiconductor device comprising the steps of:
    (a) forming a gate oxide film on a semiconductor substrate of a first conductivity type;
    (b) forming a gate electrode on said gate oxide film;
    (c) ion implanting impurities of the first conductivity type using said gate electrode as a mask to form impurity regions of the first conductivity type and ion implating impurities of a second conductivity type using said gate electrode as a mask to form impurity regions of the second conductivity type having a depth smaller than that of said impurity regions of the first conductivity type;
    (d) forming a high melting point metal layer on the surface of said gate electrode and on said impurity regions of the second conductivity type so that portions on side walls of said gate electrode become thick;
    (e) ion implanting impurities of the second conductivity type from on said high melting point metal layer; and
    (f) implementing heat treatment to form a high melting point metal compound layer on the surface of said impurity regions of the second conductivity type, and to form second impurity regions of the second conducitvty type having an impurity concentration larger than that of said impurity regions of the second conductivity type.

15. A method according to claim 14, wherein said step of forming said impurity regions of the first conductivity type and said impurity regions of the second conductivity type comprises the steps of ion implanting impurities of the first and second conductivity types in said substrate, heating said substrate in the atmosphere of oxygen to form impurity regions of the first conductivity and impurity regions of the second conductivity and to form an oxide film on the surface of said gate electrode and on the surface of said semiconductor substrate, and removing said oxide film formed on the surface of said semiconductor substrate.

16. A method according to claim 14, wherein said step for forming said impurity regions of the first conductivity type and said impurity regions of the second conductivity type comprises the steps of ion implanting impurities of the first conductivity type and impurities of the second conductivity type in said substrate, heating said substrate in the atmosphere of oxygen to form said impurity regions of the first conductivity type and said impurity regions of the second impurity type and to form an oxide film on the surface of said gate electrode and on the surface of said semiconductor substrate, and completely removing said oxide film, thus forming a high melting metal compound layer on the surface of said gate electrode.

17. A method according to claim 14, wherein said high melting point metal layer is formed on the surface of said gate electrode and on said impurity regions of the second conductivity type by vapor growth method.

18. A method according to claim 14, wherein said impurity of the first conductivity type is boron and said impurity of said second conductivity type is arsenic.

* * * * *